United States Patent [19]

Koike

[11] Patent Number: 5,495,443
[45] Date of Patent: Feb. 27, 1996

[54] DYNAMIC MEMORY HAVING A GROUND CONTROL CIRCUIT

[75] Inventor: Hiroki Koike, Tokyo, Japan

[73] Assignee: NEC Corporation, Tokyo, Japan

[21] Appl. No.: 344,696

[22] Filed: Nov. 18, 1994

[30] Foreign Application Priority Data

Nov. 18, 1993 [JP] Japan ................................. 5-288930

[51] Int. Cl.$^6$ .................................................. G11C 11/34
[52] U.S. Cl. ................ 365/189.09; 365/149; 365/189.01
[58] Field of Search ............................... 365/149, 189.09, 365/189.01

[56] References Cited

PUBLICATIONS

"A 45–ns 64–Mb DRAM with a Merged Match–Line Test Architecture"; Shigeru Mori et al.; IEEE Journal of Solid–State Circuits, vol. 26, No. 11, Nov. 1991; pp. 1486–1491.
"An Experimental 1.5–V 64–Mb DRAM"; Yoshinobu Nakagome et al.; IEEE Journal of Solid–State Circuits, vol. 26, No. 4, Apr. 1991; pp. 465–471.
Taguchi et al. "A 40–ns 64–Mb DRAM with 64–b Parallel Data Bus Architecture" IEEE of Solid–State Citcuits vol. 26, No. 11, Nov. 1991, pp. 1493–1497.
Nakagome et al. "A 1.5 Circuit Technology for 64 Mb DRAMs" 1990 Symposium on VLSI Circuits, Jun. 1991, pp. 17–18.
Nakagome et al. "Reviews and Prospects of DRAM Technology" Transactions of the Institute of Electronics, Information and Communication Engineers of Japan vol. E74, No. 4, Apr. 1991 pp. 799–810.

Primary Examiner—David C. Nelms
Assistant Examiner—F. Niranjan
Attorney, Agent, or Firm—Whitham, Curtis, Whitham & McGinn

[57] ABSTRACT

In a dynamic memory, a ground control circuit is provided for each one memory cell array, and includes a first ground control transistor connected between ground and a source of a grounding transistor in all selection read circuits associated to the corresponding memory cell array. A gate of the transistor is connected to receive a block selection signal which is brought into a selection level at a predetermined timing when the corresponding memory cell array includes a selected memory cell, so that the source of the grounding transistor in all the selection read circuits associated to the corresponding memory cell array are connected to the ground through the first ground control transistor. Two second ground control transistors having a current drive capacity smaller than that of the first ground control transistor, are connected in parallel to the first ground control transistor. A gate of the second ground control transistors is connected to receive a plurality of reset signals which are in common to the plurality of memory cell arrays and which are brought into an active level at different timings during a period excluding an active period of the plurality of sense amplifiers.

6 Claims, 6 Drawing Sheets

DYNAMIC MEMORY HAVING A GROUND CONTROL CIRCUIT

BACKGROUND OF THE INVENTION

1. Field of the Invention

The present invention relates to a dynamic memory, and more specifically to a dynamic memory is configured to transfer to a read-out signal line a read-out signal received to a gate of a transistor selected by a column selection signal in common to a plurality of memory cell arrays.

2. Description of Related Art

In dynamic memories such as a dynamic random access memory (DRAM), one means for speeding up the read-out operation is so configured that, when a read-out data on a bit line amplified by a sense amplifier is transferred to an output amplifier in a next stage, the read-out data is applied to a gate of a transistor, and then, transferred to the output amplifier. This configuration is disclosed by, for example, Y. Nakagome, et al., "An Experimental 1.5-V 64-Mb DRAM", IEEE Journal of Solid State Circuits, Vol. 26, No.4, page 465–472, April 1991, and S. Mori, et al., "A 45-ns 64-Mb DRAM with a Merged Match-Line Test Architecture", IEEE Journal of Solid State Circuits, Vol. 26, No.11, page 1486–1492, November 1991, the disclosure of both of which is incorporated by reference in their entirety into the present application. This configuration will be called a "gate receiving read-out circuit" hereinafter.

Figure 1:
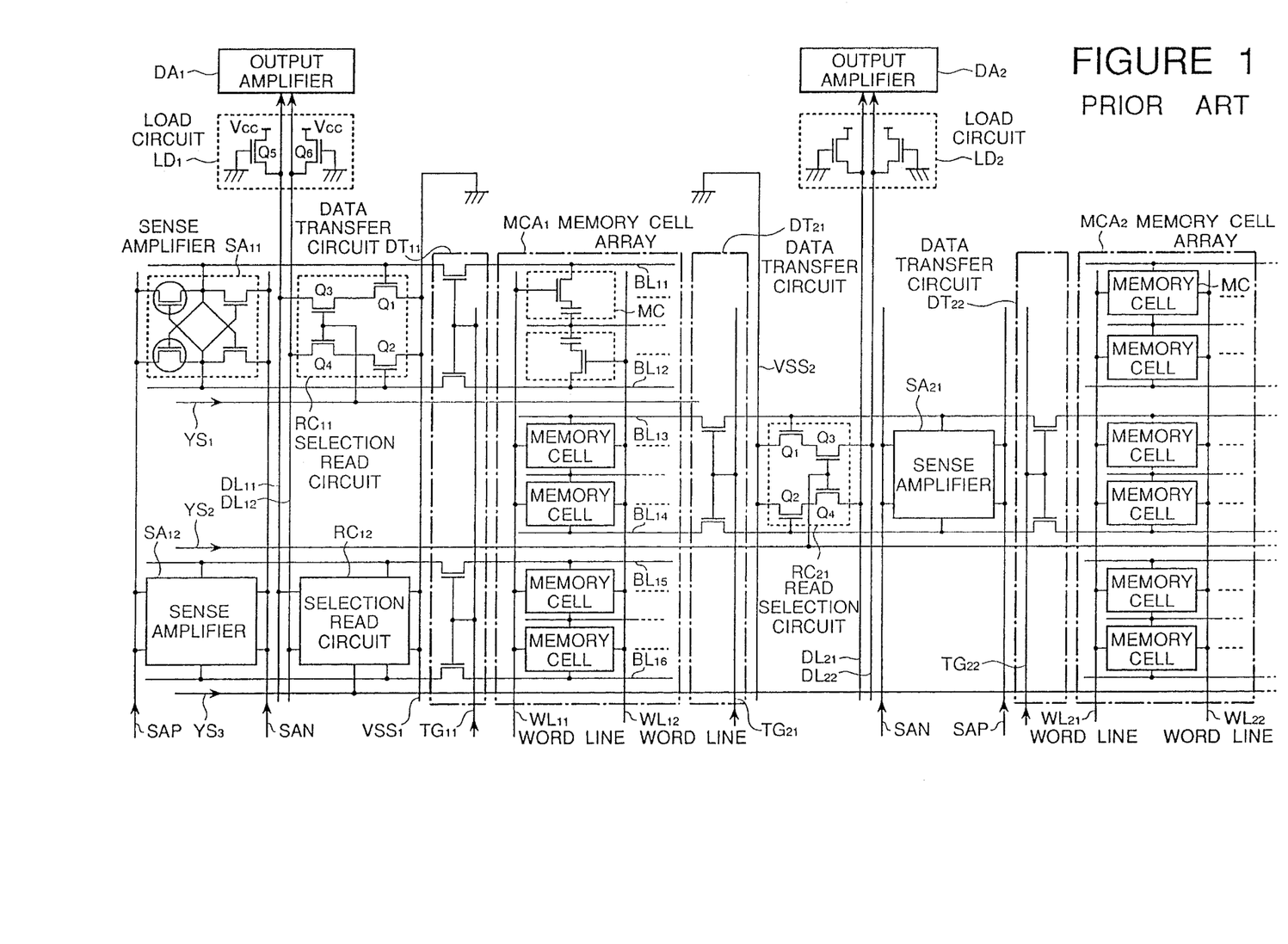
FIG. 1 is a circuit diagram of the conventional dynamic memory.

With reference to FIG. 1, one example of this type conventional dynamic memory will be now described.

This dynamic memory includes a plurality of memory cell arrays (MCA1, MCA2, . . . ), each of which includes a plurality of dynamic memory cells MC arranged in the form of a matrix having a plurality of rows and a plurality of columns, and a plurality of bit lines (for example, BL11 to BL16) each provided for each column of dynamic memory cells MC, for transferring a signal from the selected memory cell. The dynamic memory also includes a plurality of word lines (WL11, WL12, . . . , WL21, WL22, . . . ) for selecting a predetermined memory cell in a predetermined row in the plurality of memory cell arrays (MCA1, MCA2, . . . ), and a plurality of sense amplifiers (SA11, SA12, . . . , SA21, . . . ) provided one for each two columns of the plurality of memory cell arrays (MCA1, MCA2, . . . ), and activated at a predetermined timing in accordance with activation control signals SAP and SAN, so as to amplify a signal on a pair of bit lines.

Furthermore, the dynamic memory includes a plurality of data transfer circuits (DT11, DT21, DT22, . . . ) each located between one of the sense amplifiers (SA11, SA12, . . . , SA21, . . . ) and a corresponding memory cell array (MCA1, MCA2, . . . ) and configured to transfer a signal between the memory cell array and the sense amplifier at a predetermined timing in accordance with a data transfer signal (TG11, TG21, TG22, . . . ) and a plurality of read-out signal lines (DL11/DL12, DL21/DL22, . . . ) connected to the memory cell arrays (MCA1, MCA2, . . . ), respectively. In addition, the dynamic memory includes a plurality of selection read circuits (RC11, RC12, . . . , RC21, . . . ) of the gate receiving type, provided for the sense amplifiers (SA11, SA12, . . . , SA21, . . . ), respectively.

Each of the selection read circuits includes a pair of source-grounded first transistors Q1 and Q2 having their gate connected to receive a pair of complementary output signals of a corresponding sense amplifier, and a pair of second transistors Q3 and Q4 connected between a drain of the first transistors (Q1 and Q2) and a corresponding pair of read-out signal lines (DL11/DL12, DL21/DL22, . . . ), gates of the second transistors Q3 and Q4 being connected to receive a column selection signal (YS1, YS2, YS3, . . . ) in common to the memory cell arrays for controlling connection between the drain of the first transistors (Q1 and Q2) and the corresponding pair of read-out signal lines (DL11/DL12, DL21/DL22, . . . ). When the column selection signal is at a selection level, the selection read circuit transfers an amplified signal of the corresponding sense amplifier to a corresponding read-out line.

Moreover, the dynamic memory includes a plurality of load circuits (LD1, LD2, . . . ) provided for the read-out signal lines (DL11/DL12, DL21/DL22, . . . ), respectively, and including a pair of third transistors Q5 and Q6 connected between a corresponding pair of read-out signal lines and a voltage supply voltage so as to function as a load of a corresponding selection read circuit, and a plurality of output amplifiers (DA1, DA2, . . . ) connected to amplify a signal on the read-out signal lines (DL11/DL12, DL21/DL22, . . . ), so as to output an amplified signal to an external.

In the above mentioned dynamic memory, the memory cells in odd-numbered columns in each row of the memory cell arrays (MCA1, MCA2, . . . ) are selected by odd-numbered word lines, and the memory cells in even-numbered columns in each row are selected by even-numbered word lines. The sense amplifiers, the selection read circuits and the data transfer circuits are alternatively located at a right side or a left side of each two columns of memory cell arrays, so that the sense amplifiers, the selection read circuits and the data transfer circuits positioned between two adjacent memory cell arrays, are used in common to these two adjacent memory cell arrays. Therefore, a shared sense-up type of dynamic memory is constituted, so that an overall arrangement of the dynamic memory is as shown in FIG. 2.

Figure 2:
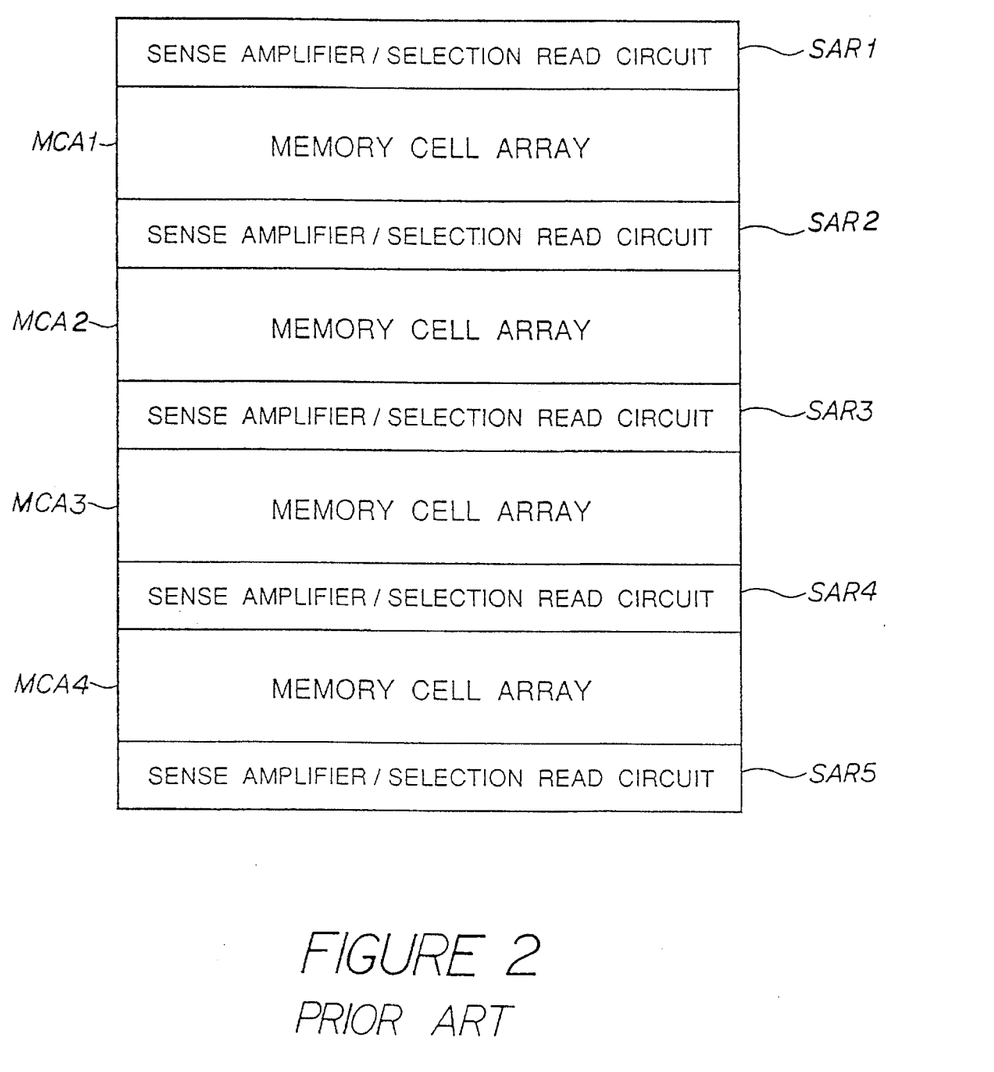
FIG. 2 illustrates an overall structure of the dynamic memory shown in FIG. 1.

In FIG. 2, each sense amplifier/selection read circuit SAR1 to SAR5 includes the sense amplifiers, the selection read circuits, the data transfer circuit, the read-out signal lines, the load circuit and the output amplifier.

Figure 3:
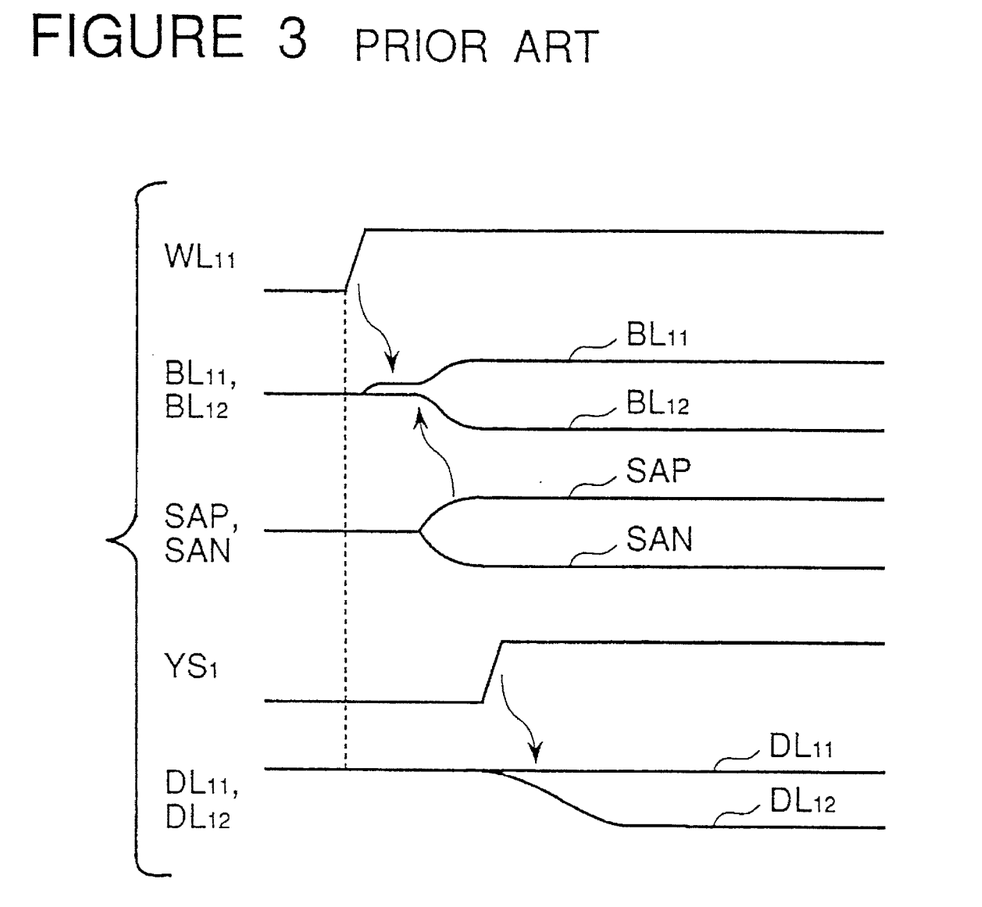
FIG. 3 is a timing chart for illustrating an operation of the dynamic memory shown in FIG. 1.

Now, operation of this conventional dynamic memory will be explained with reference to a timing chart of FIG. 3.

For example, if the word line WL11 is brought to a selection level in response to a given row address signal (not shown), a voltage difference based on data stored in the memory cells connected to the word line WL11, appears between the respective pairs of bit lines (BL11/BL12, BL13/BL14, BL15/BL16, . . . ) of the memory cell array MCA1, which were set to an intermediate level between a high level and a low level. The voltage difference is transferred through the data transfer circuit DT11 to the sense amplifiers SA11, SA12. If the sense amplifiers are activated by the activation signals SAP and SAN, the transferred voltage difference is amplified by the sense amplifier to a difference between a voltage supply voltage level and a ground potential level.

Thereafter, if one of the column selection signals, for example, YS1 is brought to a selection level, the signal amplified by the sense amplifier (SA11) is transferred through the selection read circuit RC11 to the read-out signal lines DL11/DL12, and further, amplified by the output amplifier so as to be outputted to the external.

In the above mentioned dynamic memory, since the column selection signals (YS1, YS1, YS3, . . . ) are in common to a plurality of memory cell arrays (MCA1, MCA2, . . . ), the bit lines of the memory cell arrays which do not include the selected memory cells, and the input/ output terminals of the corresponding sense amplifiers remain at the intermediate potential level. Because of this, the transistors Q1 and Q2 in the corresponding read selection circuit are turned on, so that a voltage supply current flows through the transistors Q5 and Q6 of the load circuit, the transistors Q3 and Q4 of the selection read circuit, and then, the transistors Q1 and Q2 of the selection read circuit. As a result, a consumed electric power is increased.

It is possible to block the above mentioned voltage supply current, by inserting a ground controlling transistor between the source of the transistors Q1 and Q2 and the ground, and by turning on only the ground controlling transistor corresponding to the memory cell array including the selected memory cells. However, this approach is not satisfactory for the following reason: Since the sources of the transistors Q1 and Q2 of many selection read circuits are connected in common to each other, the sources of the transistors Q1 and Q2 have a large parasitic capacitance. In addition, the parasitic capacitance are charged to a level near to the voltage supply voltage through the selection read circuit corresponding to the column selection signal of the selection level. Furthermore, the ground controlling transistor is set to have a large a current driving capacity, for the purpose of preventing a floating of the source potential of the transistors Q1 and Q2 in the selected circuit (lowering of the reading voltage), and for realizing a high speed operation. Accordingly, when the selection read circuit is brought from a non-selected condition to a selected condition, a large current (particularly having a large peak value) flows through the ground controlling transistor. This large current gives an adverse influence to the other circuits.

SUMMARY OF THE INVENTION

Accordingly, it is an object of the present invention to provide a dynamic memory which has overcome the above mentioned defect of the conventional one.

Another object of the present invention is to provide a dynamic memory configured to prevent a lowering of the read-out voltage and an adverse influence to other circuits, and capable of operating at a high speed with a reduced consumed electric power.

The above and other objects of the present invention are achieved in accordance with the present invention by a dynamic memory comprising:

a plurality of memory cell arrays each of which includes a plurality of memory cells arranged in the form of a matrix having a plurality of rows and a plurality of columns, and a plurality of bit lines each provided for each column of memory cells, for transferring a signal from the selected memory cell;

a plurality of word lines for selecting a predetermined memory cell in a predetermined row in the plurality of memory cell arrays;

a plurality of sense amplifiers each provided for one corresponding column of the plurality of memory cell arrays, and activated at a predetermined timing so as to amplify a received signal on a pair of bit lines;

a plurality of data transfer circuits each located between a corresponding one of the sense amplifiers and a corresponding memory cell array, and configured to transfer a signal between the corresponding memory cell array and the corresponding sense amplifier at a predetermined timing;

a plurality of read-out signal lines connected to the memory cell arrays, respectively;

a plurality of selection read circuits each provided for a corresponding one of the sense amplifiers, and each including a first transistor having a gate connected to receive an output signals of the corresponding sense amplifier, and a second transistor connected between a drain of the first transistor and a corresponding read-out signal line, a gate of the second transistor being connected to receive a column selection signal in common to the plurality of memory cell arrays, for controlling connection between the drain of the first transistor and the corresponding read-out signal line, each selection read circuit operating to transfer an amplified signal of the corresponding sense amplifier to the corresponding read-out line, when the column selection signal is at a selection level;

a plurality of load circuits each provided for a corresponding one of the read-out signal lines, and including a third transistor connected between a corresponding read-out signal line and a voltage supply voltage so as to function as a load of a corresponding selection read circuit;

a plurality of output amplifiers each of connected to a corresponding one of the read-out signal lines for amplifying a signal on the corresponding read-out signal line so as to output an amplified signal to an external;

a plurality of reference voltage connection control circuits each provided for a corresponding one of the plurality of memory cell arrays, each of the reference voltage connection control circuits including a fourth transistor connected between a reference voltage and the source of the first transistor in all the selection read circuits associated to the corresponding memory cell array, a gate of the fourth transistor being connected to receive a block selection signal which is brought into a selection level at a predetermined timing when the corresponding memory cell array includes a selected memory cell, so that the source of the first transistor in all the selection read circuits associated to the corresponding memory cell array are connected to the reference voltage through the fourth transistor, and fifth transistors having a current drive capacity smaller than that of the fourth transistor, and connected in parallel to the fourth transistor, a gate of the fifth transistors being connected to receive a plurality of reset signals which are in common to the plurality of memory cell arrays and which are brought into an active level at different timings during a period excluding an active period of the plurality of sense amplifiers.

In a preferred embodiment, the reference voltage connection control circuit includes a clamping element connected between the reference voltage and the source of the first transistor in all the selection read circuits associated to the corresponding memory cell array, for clamping a voltage difference between the reference voltage and the source of the first transistor to a predetermined voltage.

The above and other objects, features and advantages of the present invention will be apparent from the following description of preferred embodiments of the invention with reference to the accompanying drawings.

DESCRIPTION OF THE PREFERRED EMBODIMENTS

Figure 4:
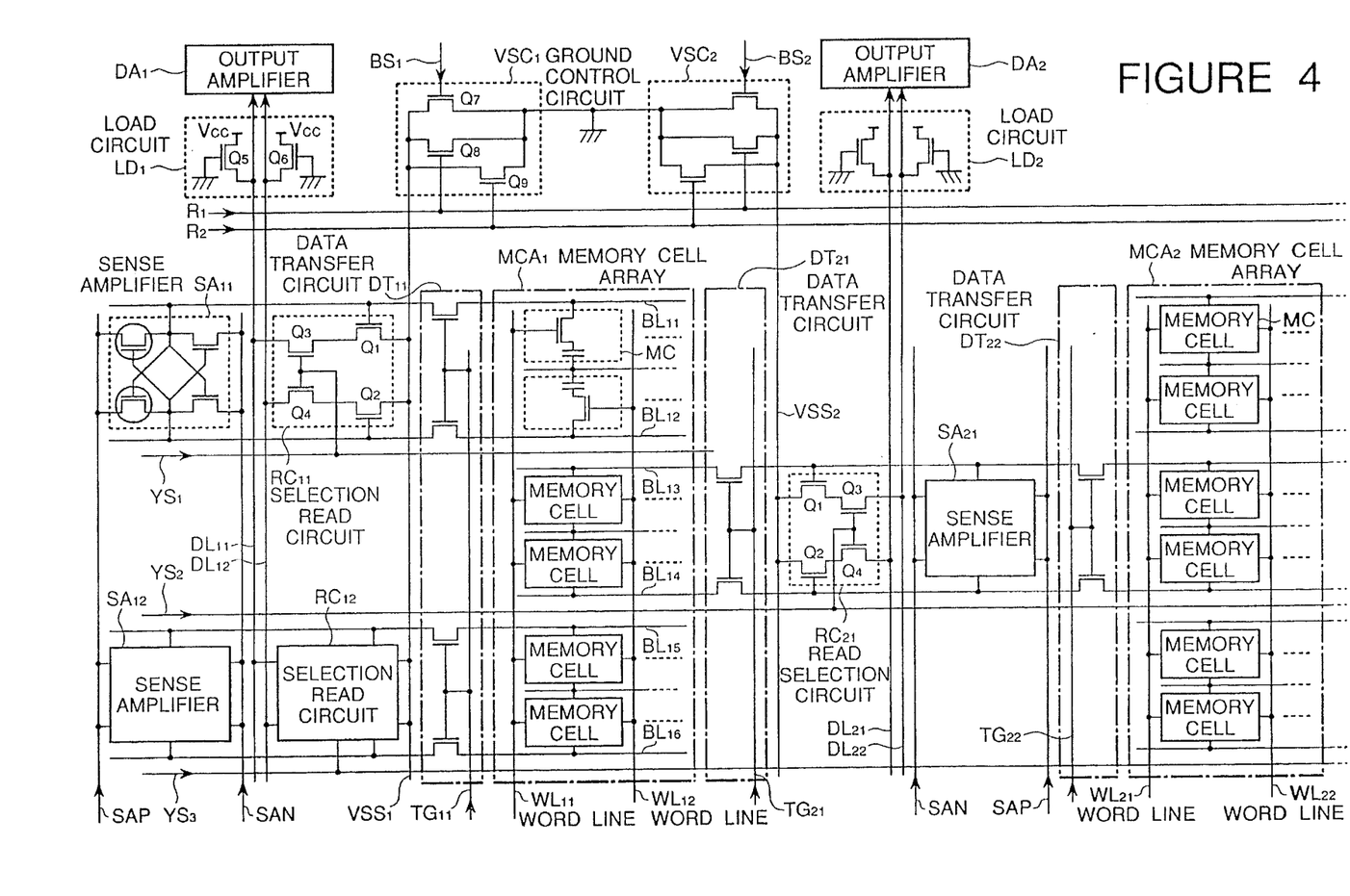
FIG. 4 is a circuit diagram of one embodiment of the dynamic memory in accordance with the present invention.

Referring to FIG. 4, there is shown a circuit diagram of one embodiment of the dynamic memory in accordance with the present invention. In FIG. 4, elements similar to those shown in FIG. 1 are given the same Reference Numerals, and explanation thereof will be omitted for simplification of the description.

The embodiment shown in FIG. 4 is different from the conventional dynamic memory shown in FIG. 1 in that the embodiment shown in FIG. 4 additionally includes a plurality of ground control circuits VSC1, VSC2, ... Each of the ground control circuits VSC1, VSC2, ... includes a transistor Q7 connected between ground and a common source line VSS1 (or VSS2, ...) of all the transistors Q1 and Q2 of the plurality of selection read circuits RC11, RC12, ... (or RC21, ..., or ...) arranged at each side of each of the memory cell arrays MCA1, MCA2, ... A gate of the transistor Q7 is connected to receive a block selection signal BS1 (or BS2 or ...), which is activated to a selection level at a predetermined timing when the corresponding memory cell array contains a selected memory cell, so that the transistor Q7 connects the associated common source line VSS1 (or VSS2, ...) of all the transistors Q1 and Q2 of the corresponding selection read circuits RC11, RC12, ... (or RC21, ..., or ...) to ground.

Each of the ground control circuits VSC1, VSC2, ... also includes a plurality of transistors Q8 and Q9 having a current drive capacity smaller than that of the transistor Q7. The transistors Q8 and Q9 are connected in parallel to the transistor Q7 and have a gate connected to receive different reset signals R1 and R2, respectively, which are in common to the plurality of memory cell arrays, and which are brought to an active level at different timings, respectively, during a period other than an activated period of the sense amplifiers.

Figure 5:
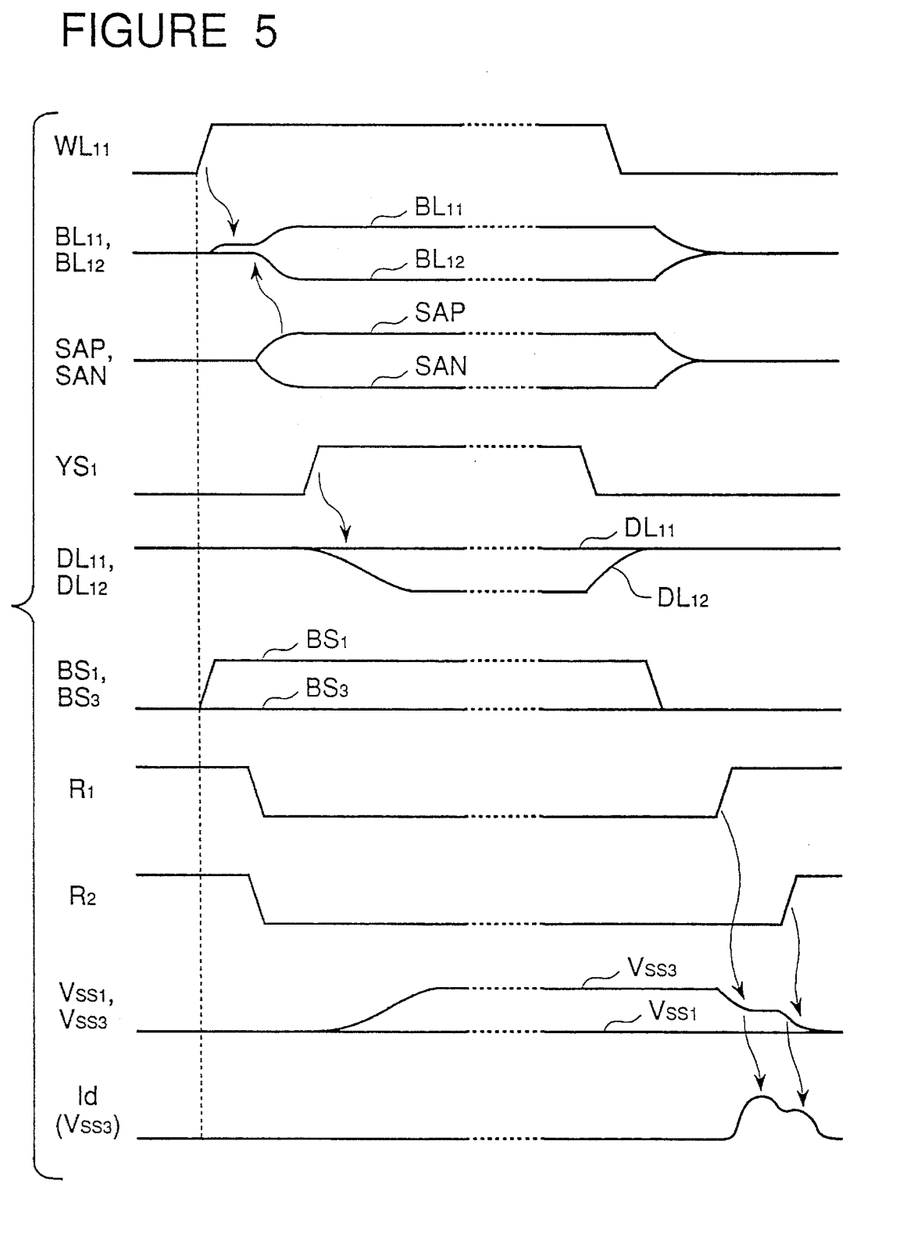
FIG. 5 illustrates an overall structure of the dynamic memory shown in FIG. 4.

Now, operation of the embodiment shown in FIG. 4 will be explained with reference to the timing chart of FIG. 5, illustrating changes of various signals when the word line WL11 is activated to the selection level.

At the same time as the word line WL11 is activated to the selection level, the block selection signal BS1 is activated to the selection level, so that the transistor Q7 of the ground control circuit VSC1 is turned on to connect the common source line VSS1 of the transistors Q1 and Q2 of the selection read circuits RC11, RS12, ..., to the ground potential level. The succeeding operation is similar to the corresponding operation of the conventional example. In brief, the data of the memory cell which is included in the row selected by the word line WL11 and included in the column selected by the column selection signal (for example, YS1), is read out through the selection read circuit (RC11), the read-out signal lines (DL11/DL12) and the output amplifier (DA1) to the external.

On the other hand, after the block selection signal BS1 is activated to the selection level, the reset signals R1 and R2 are brought from an inactive level to an active level, so as to turn off the transistors Q8 and Q9 in all the ground control circuits VSC1, VSC1, ... In addition, the block selection signals (for example, BS3 not shown in FIG. 4) corresponding to the non-selected memory cell arrays (for example, MCA2) which do not include the selected memory cell, are maintained at a non-selection level, and therefore, the transistor Q7 included in the ground control circuit (for example, VSC3 not shown in FIG. 4) corresponding to the non-selected memory cell arrays. Accordingly, the common source lines (for example, VSS3 not shown in FIG. 4) of the transistors Q1 and Q2 included in the selection read circuits corresponding to the non-selected memory cell arrays (for example, MCA2) which do not include the selected memory cell, are in a floating condition. As a result, although the common source line is charged to the voltage supply voltage through the transistors Q3 and Q4 of the corresponding selection read circuit in response to the column selection signal (for example, YS1) of the selection level, no further current flows, and therefore, the consumed electric power can be reduced.

After the reading of the data of the selected memory cell is completed, and after the word line WL1, the column selection signal YS1 and the block selection signal BS1 are brought to the non-selection level, the reset signals R1 and R2 are brought to an active level at different timings, respectively, as shown in FIG. 5. Accordingly, the transistors Q8 and Q9 of all the ground control circuits VSC1, VSC2, ... are sequentially turned on in response to the reset signals R1 and R2, so that the common source lines (VSS3, etc) which had been charged to the voltage supply voltage, are discharged and become the ground potential level.

It is sufficient if the discharge of the common source lines through the transistors Q8 and Q9 is completed until a next selected word line is brought to the selection level. Therefore, it is possible to reduce the current drive capacity of the transistors Q8 and Q9 so as to make the discharge current small. In addition, since the discharge currents through the transistors Q8 and Q9 are diversified in time by the reset signals R1 and R2 having the different timings, a peak value of the discharge current can be further reduced, as shown by the waveform Id in FIG. 5. Thus, it is possible to prevent an adverse influence (for example, malfunction due to noises) caused by the discharge circuit to influence another circuits.

Furthermore, during a period in which the transistors Q8 and Q9 are on, the transistor Q7 is turned on in response to the block selection signal. Therefore, at the moment the transistor Q7 is turned on, no current flows through the transistor Q7. Accordingly, in order to prevent the rise-up of the potential of the common source line (VSS1, VSS2, ...) in the selected condition, the current drive capacity of the transistor Q7 can be made sufficiently large. As a result, the drop in level of the read-out data can be prevented, and a high speed operation can be ensured.

Incidentally, the reset signals R1 and R2 and the block selection signals BS1, BS2, ... can be easily generated in an existing timing control circuit (not shown) used for generating the activation signals SAP and SPN, the column selection signals, and others, for the purpose of controlling operation timings of various parts.

Figure 6:
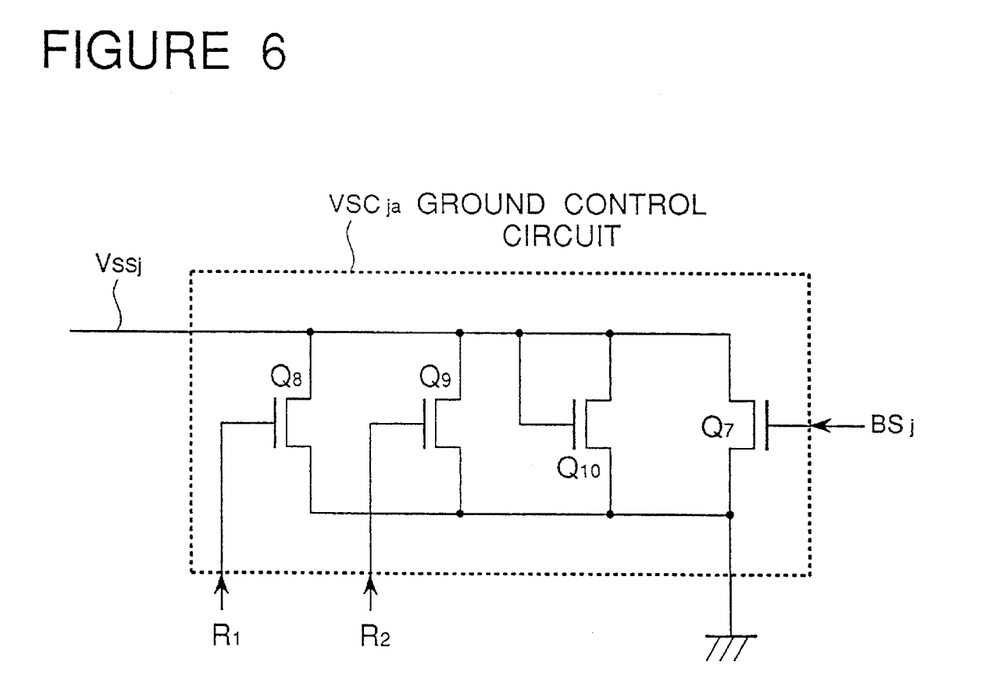
FIG. 6 is a circuit diagram of another embodiment of the ground control circuit incorporated in the dynamic memory shown in FIG. 4.

Referring to FIG. 6, there is shown a circuit diagram of another embodiment of the ground control circuit incorporated in the dynamic memory shown in FIG. 4.

The ground control circuit VSCja (where j=1 to N, N is the total number of the ground control circuits) of the second embodiment is characterized in that the ground control circuit VSCj of the first embodiment is added with a source-grounded transistor Q10 having a predetermined threshold, and having a gate and a drain connected in common to the source common line VSSj, so as to function as a clamp element.

In this second embodiment, it is possible to suppress the charged voltage of the common source line VSSj in the non-selected condition, to the threshold level of the transistor 10. Therefore, the discharge current of the common source line VSSj can be further reduced in comparison with the first embodiment, and the time until the common source line is brought to and becomes stable at the ground potential level, can be shortened.

In the above mentioned embodiments, there are used the two transistors Q8 and Q9 turned on when the transistor Q7 is turned on. However, these transistors Q8 and Q9 can be replaced with a single transistor if the adverse influence of the discharge current is not so significant. Of course, these transistors Q8 and Q9 can be replaced with three or more transistors.

The invention has thus been shown and described with reference to the specific embodiments. However, it should be noted that the present invention is in no way limited to the details of the illustrated structures but changes and modifications may be made within the scope of the appended claims.

I claim:

1. A dynamic memory comprising:

a plurality of memory cell arrays each of which includes a plurality of memory cells arranged in the form of a matrix having a plurality of rows and a plurality of columns, and a plurality of bit lines each provided for each column of memory cells, for transferring a signal from the selected memory cell;

a plurality of word lines for selecting a predetermined memory cell in a predetermined row in the plurality of memory cell arrays;

a plurality of sense amplifiers each provided for one corresponding column of the plurality of memory cell arrays, and activated at a predetermined timing so as to amplify a received signal on a pair of bit lines;

a plurality of data transfer circuits each located between a corresponding one of the sense amplifiers and a corresponding memory cell array, and configured to transfer a signal between the corresponding memory cell array and the corresponding sense amplifier at a predetermined timing;

a plurality of read-out signal lines connected to the memory cell arrays, respectively;

a plurality of selection read circuits each provided for a corresponding one of the sense amplifiers, and each including a first transistor having a gate connected to receive an output signals of the corresponding sense amplifier, and a second transistor connected between a drain of the first transistor and a corresponding read-out signal line, a gate of the second transistor being connected to receive a column selection signal in common to the plurality of memory cell arrays, for controlling connection between the drain of the first transistor and the corresponding read-out signal line, each selection read circuit operating to transfer an amplified signal of the corresponding sense amplifier to the corresponding read-out line, when the column selection signal is at a selection level;

a plurality of load circuits each provided for a corresponding one of the read-out signal lines, and including a third transistor connected between a corresponding read-out signal line and a voltage supply voltage so as to function as a load of a corresponding selection read circuit;

a plurality of output amplifiers each of connected to a corresponding one of the read-out signal lines for amplifying a signal on the corresponding read-out signal line so as to output an amplified signal to an external;

a plurality of reference voltage connection control circuits each provided for a corresponding one of the plurality of memory cell arrays, each of the reference voltage connection control circuits including a fourth transistor connected between a reference voltage and the source of the first transistor in all the selection read circuits associated to the corresponding memory cell array, a gate of the fourth transistor being connected to receive a block selection signal which is brought into a selection level at a predetermined timing when the corresponding memory cell array includes a selected memory cell, so that the source of the first transistor in all the selection read circuits associated to the corresponding memory cell array are connected to the reference voltage through the fourth transistor, and fifth transistors having a current drive capacity smaller than that of the fourth transistor, and connected in parallel to the fourth transistor, a gate of the fifth transistors being connected to receive a plurality of reset signals which are in common to the plurality of memory cell arrays and which are brought into an active level at different timings during a period excluding an active period of the plurality of sense amplifiers.

2. A dynamic memory claimed in claim 1 wherein the reference voltage connection control circuit includes a clamping element connected between the reference voltage and the source of the first transistor in all the selection read circuits associated to the corresponding memory cell array, for clamping a voltage difference between the reference voltage and the source of the first transistor to a predetermined voltage.

3. A dynamic memory claimed in claim 2 wherein the clamping element is formed of a sixth transistor having a predetermined threshold corresponding to the predetermined voltage.

4. A dynamic memory comprising:

a plurality of memory cell arrays each of which includes a plurality of memory cells arranged in the form of a matrix having a plurality of rows and a plurality of columns, and a plurality of bit lines each provided for each column of memory cells, for transferring a signal from the selected memory cell;

a plurality of word lines for selecting a predetermined memory cell in a predetermined row in the plurality of memory cell arrays;

a plurality of sense amplifiers each provided for one corresponding column of the plurality of memory cell arrays, and activated at a predetermined timing so as to amplify a received signal on a pair of bit lines;

a plurality of data transfer circuits each located between a corresponding one of the sense amplifiers and a corresponding memory cell array, and configured to transfer a signal between the corresponding memory cell array and the corresponding sense amplifier at a predetermined timing;

a plurality of read-out signal lines connected to the memory cell arrays, respectively;

a plurality of selection read circuits each provided for a corresponding one of the sense amplifiers, and each including a first transistor having a gate connected to receive an output signals of the corresponding sense amplifier, and a second transistor connected between a drain of the first transistor and a corresponding read-out signal line, a gate of the second transistor being connected to receive a column selection signal in common to the plurality of memory cell arrays, for controlling connection between the drain of the first transistor and the corresponding read-out signal line, each selection read circuit operating to transfer an amplified signal of the corresponding sense amplifier to the corresponding read-out line, when the column selection signal is at a selection level;

a plurality of load circuits each provided for a corresponding one of the read-out signal lines, and including a third transistor connected between a corresponding read-out signal line and a voltage supply voltage so as to function as a load of a corresponding selection read circuit;

a plurality of output amplifiers each of connected to a corresponding one of the read-out signal lines for amplifying a signal on the corresponding read-out signal line so as to output an amplified signal to an external;

a plurality of ground control circuits each provided for a corresponding one of the plurality of memory cell arrays, each of the ground control circuits including a fourth transistor connected between ground and the source of the first transistor in all the selection read circuits associated to the corresponding memory cell array, a gate of the fourth transistor being connected to receive a block selection signal which is brought into a selection level at a predetermined timing when the corresponding memory cell array includes a selected memory cell, so that the source of the first transistor in all the selection read circuits associated to the corresponding memory cell array are connected to the ground through the fourth transistor, and at least one fifth transistor having a current drive capacity smaller than that of the fourth transistor, and connected in parallel to the fourth transistor, a gate of the fifth transistor being connected to receive a reset signal which is in common to the plurality of memory cell arrays and which is brought into an active level during a period excluding an active period of the plurality of sense amplifiers.

5. A dynamic memory claimed in claim 4 wherein the ground control circuit includes a clamping element connected between the ground and the source of the first transistor in all the selection read circuits associated to the corresponding memory cell array, for clamping a voltage difference between the ground and the source of the first transistor to a predetermined voltage.

6. A dynamic memory claimed in claim 5 wherein the clamping element is formed of a sixth transistor having a predetermined threshold corresponding to the predetermined voltage.

* * * * *